United States Patent
Frana et al.

(10) Patent No.: US 11,540,427 B2
(45) Date of Patent: Dec. 27, 2022

(54) CONVERTER HAVING A SEPARATE INTERIOR

(71) Applicant: Siemens Aktiengesellschaft, Munich (DE)

(72) Inventors: Christian Frana, Cadolzburg (DE); Stefan Lodes, Pottenstein (DE); Klaus Nieberlein, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/280,650

(22) PCT Filed: Sep. 17, 2019

(86) PCT No.: PCT/EP2019/074781
§ 371 (c)(1),
(2) Date: Mar. 26, 2021

(87) PCT Pub. No.: WO2020/064410
PCT Pub. Date: Apr. 2, 2020

(65) Prior Publication Data
US 2021/0385980 A1 Dec. 9, 2021

(30) Foreign Application Priority Data
Sep. 27, 2018 (EP) .................................. 18197064

(51) Int. Cl.
*H05K 7/20* (2006.01)
(52) U.S. Cl.
CPC ..... *H05K 7/20918* (2013.01); *H05K 7/20145* (2013.01)
(58) Field of Classification Search
CPC ........... H05K 7/20918; H05K 7/20145; H05K 7/20909; H05K 7/20163; H05K 7/20136;
(Continued)

(56) References Cited

U.S. PATENT DOCUMENTS 9,795,067 B2 * 10/2017 Takezawa .............. H05K 7/209
10,165,711 B2 * 12/2018 Pallasmaa ............. H02M 7/003
(Continued)

FOREIGN PATENT DOCUMENTS

DE 112012004788 T5 8/2014
WO WO 2014149773 A1 9/2014

OTHER PUBLICATIONS

PCT International Search Report and Written Opinion of International Searching Authority dated Nov. 29, 2019 corresponding to PCT International Application No. PCT/EP2019/074781 filed Sep. 17, 2019.

*Primary Examiner* — Mandeep S Buttar
(74) *Attorney, Agent, or Firm* — Henry M. Feiereisen LLC

(57) ABSTRACT

A converter includes a housing having a first interior and a second interior. The first interior is arranged separately from the second interior. Part of the first interior protrudes into the second interior and forms a heat-exchanger duct. A gaseous heat flow circuit is established within the first interior and flows in through an inlet opening of the heat-exchanger duct and flows out through an outlet opening of the heat-exchanger duct. The second interior forms a cooling duct. A gaseous cooling flow flowing through the cooling duct is established and flows around the heat-exchanger duct. The cooling duct is arranged in a region of overlap with the heat-exchanger duct in such a way that a first flow direction of the gaseous heat flow circuit runs substantially perpendicularly or parallel to a second flow direction of the gaseous cooling flow.

16 Claims, 3 Drawing Sheets

(58) Field of Classification Search
CPC .... H05K 7/20409; H05K 7/206; H05K 7/202; H05K 7/20545; H05K 7/209; H05K 7/20009; H05K 7/20127; H05K 7/20154; H05K 7/2039; H05K 7/20418; H05K 7/20681; H05K 5/061; G06F 1/20; H01L 23/467
USPC .. 361/694, 696, 701, 679.5, 679.51, 679.54, 361/695, 715, 710, 714, 717, 730, 679.48; 165/104.33, 104.14, 80.3, 103, 122; 454/184; 257/721, E23.099
See application file for complete search history.

(56) References Cited

U.S. PATENT DOCUMENTS

| | | | |
|---|---|---|---|
| 2003/0107873 A1* | 6/2003 | Van Gaal | H05K 7/206 361/689 |
| 2009/0310301 A1* | 12/2009 | Nelson | H05K 7/20163 361/695 |
| 2010/0079940 A1* | 4/2010 | Mongia | G06F 1/20 361/679.49 |
| 2011/0108250 A1* | 5/2011 | Horng | H05K 7/20163 165/121 |
| 2013/0120934 A1* | 5/2013 | Barna | H05K 7/20918 361/689 |
| 2015/0216073 A1* | 7/2015 | Tyleshevski | H05K 7/202 361/692 |
| 2015/0296653 A1* | 10/2015 | Mathieu | H05K 7/20909 361/690 |
| 2015/0373872 A1* | 12/2015 | Khandelwal | H05K 7/20572 361/695 |
| 2016/0246338 A1* | 8/2016 | Stavi | G06F 1/182 |
| 2016/0360642 A1* | 12/2016 | Talka | H05K 7/20918 |

\* cited by examiner

CONVERTER HAVING A SEPARATE INTERIOR

CROSS-REFERENCES TO RELATED APPLICATIONS

This application is the U.S. National Stage of International Application No. PCT/EP2019/074781, filed Sep. 17, 2019, which designated the United States and has been published as International Publication No. WO 2020/064410 and which claims the priority of European Patent Application, Serial No. 18197064.1, filed Sep. 27, 2018, pursuant to 35 U.S.C. 119(a)-(d).

BACKGROUND OF THE INVENTION

The invention relates to a converter which comprises a converter housing with a first interior and a second interior, wherein the first interior is arranged separately from the second interior and a first heat loss that can be generated in the first interior during operation of the converter can be at least partially dissipated into the second interior and heat is at least partially dissipated from the first interior as a result.

In drive technology, electrical or electronic structural elements of converters for example are often subjected to aggressive environmental influences during operation, such as splashing water or dust for example, which may have a negative impact on the availability or the service life of the structural elements if protective measures are neglected.

As the simplest measure for preventing damage that may occur for converters and their electronic structural elements in particular, such as open and closed-loop control units, due to said environmental influences, these electronic structural elements or electronic structural elements combined to form electronic subassemblies may be surrounded by a housing.

The degree of isolation from the negative environmental influences that is necessary, depending on the type of use and location of use of the converter, is specified for example by the IP protection classes in the DIN EN 60529 standard. This standard defines the protection classes for protecting against directly touching the electronic structural elements, but also against penetration of solids and liquids into the converter.

One problem of this isolation of electronic structural elements or subassemblies, however, is that what is known as heat loss is generated during operation of the converter, e.g. by the electrical losses of the electronic structural elements. This heat loss has to be dissipated from the electronic structural elements, for example from processors, from passive structural elements etc., since the generation of heat may cause the degree of efficiency of the electronic structural elements in question to drop, or may possibly even cause them to be destroyed.

In known solutions, the heat dissipation of regions in converters that are isolated in this way is performed, for example, via forced air ventilation inside the converter and/or via surface convection. However, this only makes it possible to dissipate a limited amount of heat, particularly if a high degree of protection is provided for a converter of a high performance category.

Alternatively, heat dissipation systems are known for converters of higher protection classes and higher performance categories for example, in which a dissipation of the heat loss is performed by means of forced air ventilation via technically elaborate filters. These heat dissipation systems with filters are expensive, require highly intensive maintenance and often require fans with high energy requirements, in order to overcome the high air resistance and ensure the necessary air throughput.

The invention is therefore based on the object of providing a converter with a separate interior for a high protection class, in order to provide heat dissipation for the electronic structural elements of the isolated interior that generate heat loss in a less elaborate manner compared to the prior art, while the efficiency of the heat dissipation at least remains the same.

SUMMARY OF THE INVENTION

The object is achieved by a converter as set forth hereinafter.

To achieve the object, a converter is proposed which comprises a converter housing with a first interior and a second interior, wherein the first interior is arranged separately from the second interior, wherein part of the first interior protrudes into the second interior and forms a heat exchanger duct, wherein the converter can be operated such that a gaseous heat flow circuit is formed within the first interior which flows in through a first inlet opening of the heat exchanger duct and flows out through a first outlet opening of the heat exchanger duct, wherein the second interior forms a cooling duct, wherein the converter can be operated in such a manner that a gaseous cooling flow that flows through the cooling duct is formed, which flows around the heat exchanger duct, and wherein the cooling duct is arranged in a region that overlaps with the heat exchanger duct, such that a first flow direction of the gaseous heat flow circuit runs substantially perpendicularly or parallel in relation to a second flow direction of the gaseous cooling flow.

Via the heat exchanger duct, it is advantageously possible to perform a heat exchange between two interiors of the converter that are separate from one another, wherein, during operation, the gaseous heat flow circuit of the first interior is able to emit the heat which it carries to the gaseous cooling flow in the cooling duct of the second interior via the heat exchanger duct and the heat emitted in this way can be conducted away into the second interior by means of the gaseous cooling flow. The two heat flows accordingly do not mix their respective gaseous medium during the heat exchange.

If the first flow direction of the gaseous heat flow circuit runs substantially perpendicularly in relation to the second flow direction of the gaseous cooling flow, then the guided gaseous cooling flow is advantageously simultaneously able to transfer the heat of the guided gaseous heat flow circuit on a broad front.

If the first flow direction of the gaseous heat flow circuit runs substantially in parallel in relation to the second flow direction of the gaseous cooling flow, then the guided gaseous cooling flow is advantageously able to transfer the heat of the guided gaseous heat flow circuit over a longer distance.

Both ways of guiding the gaseous heat flow circuit in relation to the gaseous cooling flow have advantages, which in particular can be improved further by structurally designing the respective heat exchanger duct with regard to the thermal behavior thereof during the heat exchange.

Advantageous embodiments of the modular converter are specified in the dependent claims.

In a first advantageous embodiment of the converter, the first interior forms a space which is substantially hermetically sealed, at least during operation of the converter.

The first interior is considered to be hermetically sealed if in particular dust picked up by gaseous surrounding media, generally air, as well as liquid media, are not able to penetrate into the first interior during operation.

The first interior is at least designed for classification under the IP protection class according to DIN EN 60529 of IP5x and higher, for example, in order to be hermetically sealed in this manner.

In a further advantageous embodiment of the converter, the converter is embodied for dissipating heat loss generated during operation in such a manner that a first heat loss generated in the first interior is at least partially absorbed by the gaseous heat flow circuit, the first heat loss absorbed in this manner is at least partially transferred from the gaseous heat flow circuit to the gaseous cooling flow of the second interior by means of the heat exchanger duct and is conducted away by means of the gaseous cooling flow and a second heat loss generated in the second interior is at least partially absorbed by the gaseous cooling flow and is conducted away by means of the gaseous cooling flow.

In addition to the heat loss generated in the first interior, which is conducted into the heat exchanger duct by means of the gaseous heat flow circuit, where it is at least partially emitted to the gaseous cooling flow in the cooling duct of the second interior, the gaseous cooling flow is advantageously able to absorb a second heat loss. This second heat loss is generated in the second interior or is at least conducted into the second interior.

Both the first heat loss absorbed by the gaseous cooling flow via the heat exchanger duct and the second heat loss absorbed by the gaseous cooling flow in the second interior are conducted away by the gaseous cooling flow that forms in the cooling duct, which advantageously dissipates heat from the respective heat sources that generate the heat loss.

In a further advantageous embodiment of the converter, the converter can be operated in such a manner that the gaseous heat flow circuit in the first interior, particularly in the heat exchanger duct, is exclusively formed by free convection.

The advantage is that it is possible to dispense with structural parts for generating the gaseous heat flow circuit in the first interior. The gaseous heat flow circuit being formed by the free convection may be supported, for example, by a duct in the first interior which is spatially predefined in a fixed manner and is structurally delimited in a clear manner also determining the course and possibly the flow direction of the gaseous heat flow circuit.

In a further advantageous embodiment of the converter, the converter comprises a first flow generator for the first interior, wherein the first flow generator can be operated in such a manner that a first forced convection is generated in the first interior, particularly in the heat exchanger duct, which forms the gaseous heat flow circuit.

The generation of the forced convection by means of the first flow generator has the advantage that the gaseous heat flow circuit forms in a rapid and stable manner and a greater throughput of the first heat loss through the heat exchanger duct is achieved, which contributes to the improved efficiency of the heat dissipation of the first interior.

In a further advantageous embodiment of the converter, the flow directions running in parallel follow a common direction or opposing directions.

From a thermal perspective, the transfer of heat in the heat exchanger duct by means of the two flow directions that run in parallel, but in opposing directions, is a preferred solution. If, however, from the perspective structural requirements or from the perspective of other requirements, the flow directions that run in parallel have to run in the common direction, then here too the efficient transfer of heat in the heat exchanger duct can be achieved by the formation of the gaseous heat flow circuit and/or the gaseous cooling flow for example being supported by the generation of the forced convection, or by the throughput volume of the heat exchanger duct being increased.

In a further advantageous embodiment of the converter, the heat exchanger duct has at least two flow ducts, which are spaced apart from one another, and an intermediate space is formed where flow ducts lie immediately opposite one another, through which the gaseous cooling flow can flow.

The gaseous cooling flow is advantageously able to flow through the intermediate spaces between the individual flow ducts, and the gaseous cooling flow therefore flows around each of the individual flow ducts in a substantially comprehensive manner. In contrast to flow ducts without intermediate spaces, this increases the effective area at the heat exchanger duct, in which the gaseous cooling flow is able to transfer the first heat loss carried by the gaseous heat flow circuit.

In a further advantageous embodiment of the converter, the flow ducts are arranged in a laminated manner.

The advantage of the laminated arrangement of the flow ducts is a perfectly fitting arrangement of the flow ducts, with intermediate spaces that also run in a precise manner, which further improves the flowing of the gaseous cooling flow around the flow ducts.

In a further advantageous embodiment of the converter, the converter can be operated in such a manner that the gaseous cooling flow, particularly in the region of the cooling duct that overlaps with the heat exchanger duct, is exclusively formed by free convection.

The advantage is that it is possible to dispense with structural parts for generating the gaseous heat flow circuit in the second interior. The gaseous cooling flow being formed by the free convection may be supported, for example, by a duct in the form of a cooling duct in the second interior which is spatially predefined in a fixed manner and is structurally delimited in a clear manner also determining the course and possibly the flow direction of the gaseous cooling flow.

In a further advantageous embodiment of the converter, the converter comprises a second flow generator for the second interior, wherein the second flow generator can be operated in such a manner that a second forced convection is generated in the second interior, particularly in the region of the cooling duct that overlaps with the heat exchanger duct, which forms the gaseous cooling flow.

The generation of the forced convection by means of the second flow generator has the advantage that the gaseous cooling flow is formed in a rapid and stable manner and a greater throughput of the first heat loss transferred by the gaseous heat flow circuit in the heat exchanger duct and the second heat loss of the second interior by the gaseous cooling flow is achieved, which contributes to the improved efficiency of the heat dissipation of the first and the second interior.

In a further advantageous embodiment of the converter, the converter has a second inlet opening and/or a second outlet opening at the second interior, wherein the gaseous cooling flow can be guided into the cooling duct via the second inlet opening and/or can be guided out of the cooling duct via the second outlet opening.

By means of the inlet opening, the cooling flow provided for the cooling can be guided into the cooling duct of the second interior. If only the inlet opening is provided, then it is also possible for the cooling flow that then dissipates the heat loss to escape through the inlet opening, wherein this takes place, if necessary, by way of a pressure equalization of the inflowing gaseous cooling flow in relation to the outflowing gaseous cooling flow.

A preferred solution is formed by having the inlet opening and the outlet opening available. Two waypoints of the cooling duct are defined here, which, for the cooling duct, defines the beginning thereof at the inlet opening and the end thereof at the outlet opening in each case.

In a further advantageous embodiment of the converter, the converter comprises a first converter component that is at least partially arranged in the first interior and during operation of the converter generates the first heat loss or conducts it away.

The first converter component in the first interior may be, for example, an open or closed-loop control subassembly of the converter with processors and possibly also further electronic structural elements, which in the first interior are particularly protected in an advantageous manner from destructive environmental influences, such as dust and liquids in particular.

In a further advantageous embodiment of the converter, the converter comprises a second converter component that is at least partially arranged in the second interior and during operation of the converter generates the second heat loss or conducts it away.

The second converter component in the second interior is, for example, a power semiconductor or a power semiconductor module with power semiconductor switches, which mostly have heat sinks for immediate heat dissipation of the power semiconductor switches.

The power semiconductor switch may also, for example, be arranged as an individual structural part or as a constituent part of a power semiconductor module in the first interior (in this case as a first converter component) and the heat sink dissipating heat immediately from the power semiconductor switch or the power semiconductor module may be arranged in the second interior (in this case as a second converter component). Further electrical structural parts, such as electrical filters or busbars for example, may also be arranged as second converter component in the second interior in each case.

BRIEF DESCRIPTION OF THE DRAWING

The above-described characteristics, features and advantages of this invention, as well as the manner in which these are achieved, will become clearer and more readily understandable in connection with the following description of the exemplary embodiments, which are explained in more detail in conjunction with the figures, in which.

DETAILED DESCRIPTION OF PREFERRED EMBODIMENTS

Figure 1:
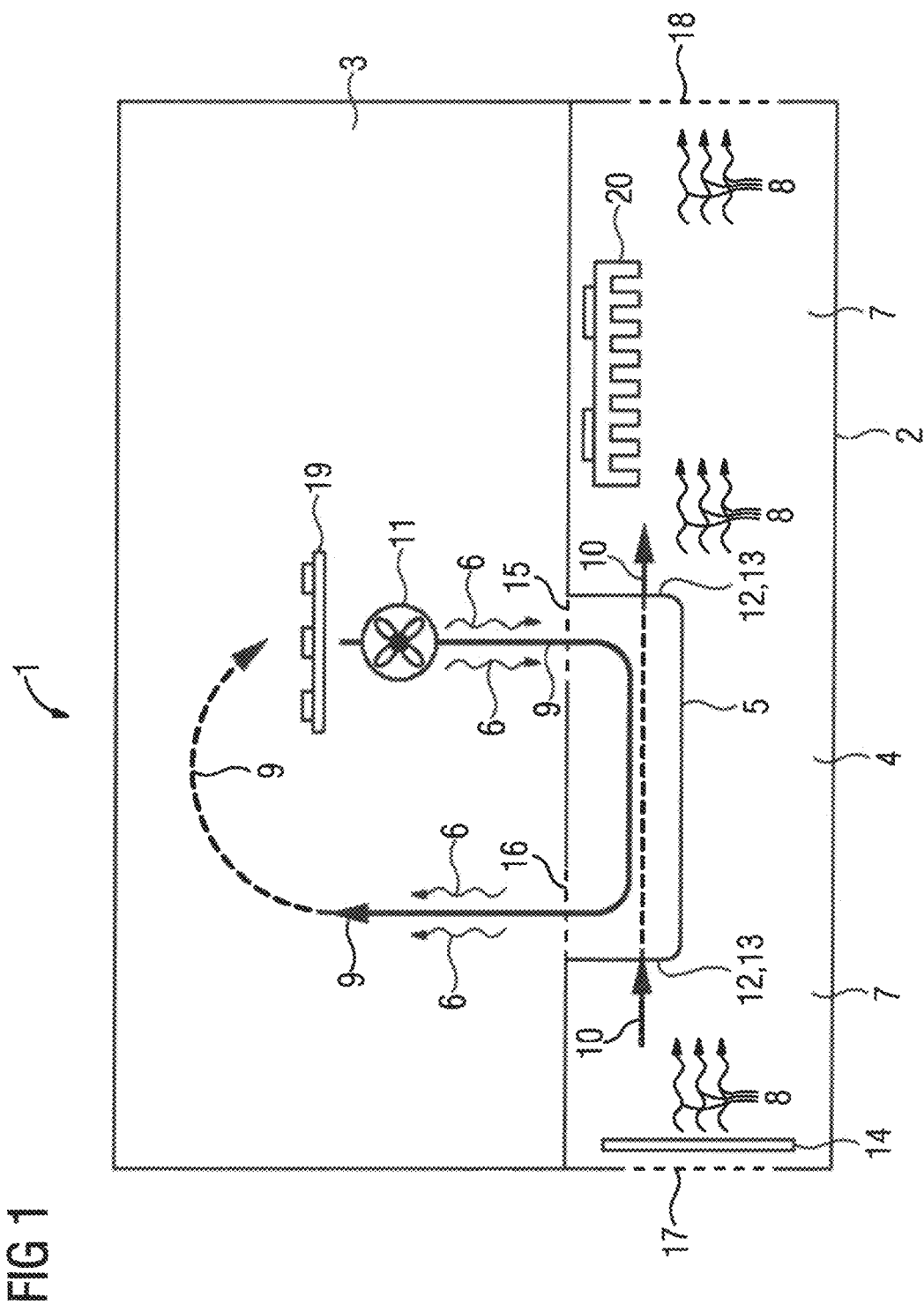
FIG. 1 shows a schematic representation of a converter according to the invention with a heat exchanger duct.

FIG. 1 shows a schematic representation of a converter 1 according to the invention with a heat exchanger duct 5.

The converter 1 has a converter housing 2 with a first interior 3 and a second interior 4. The first interior 3 is arranged separately from the second interior 4. The first interior 3 may be hermetically sealed from all of its surroundings, and therefore may form a hermetically sealed space.

In this context, part of the first interior 3 protrudes into the second interior 4 and forms the heat exchanger duct 5. The converter 1 can be operated such that a gaseous heat flow circuit 6 is formed within the first interior 3. The formation of the gaseous heat flow circuit 6 in a first flow direction 9 is supported here by a first flow generator 11, e.g. an electrical fan.

During operation, the gaseous heat flow circuit 6 absorbs a first heat loss from a first converter component 19, such as an open or closed-loop control subassembly with processor and further electronic structural elements. By means of the forced convection generated here by the first flow generator 11, the gaseous heat flow circuit 6 is guided into the heat exchanger duct 5 through the first inlet opening 15. While the gaseous heat flow circuit 6 flows through the heat exchanger duct 5, a gaseous cooling flow 8 flows in a second flow direction 10 around the heat exchanger duct 5 in a cooling duct 7 of the second interior 4.

The gaseous cooling flow 8 at least partially absorbs the first heat loss carried by the gaseous heat flow circuit 6 at the heat exchanger duct 5—in the region where the gaseous heat flow circuit 6 overlaps with the gaseous cooling flow 8—and dissipates this first heat loss from the heat exchanger duct 5.

The formation of the gaseous cooling flow 8 is supported in FIG. 1 by a second flow generator 14, which here by way of example is arranged in the second interior 4 of the converter 1, wherein the second flow generator 14 predefines the second flow direction 10 of the gaseous cooling flow 8. The gaseous cooling flow 8 flows through the cooling duct 7 of the second interior 4 with the second flow direction 10, wherein the heat exchanger duct 5 protruding into the second interior 4 is arranged in the cooling duct 7.

The gaseous heat flow circuit 6 escapes at the first outlet opening 16 of the heat exchanger duct 5, wherein it has emitted a majority of the first heat loss of the first converter component 19 to the gaseous cooling flow 8 and the gaseous cooling flow 8 conducts the first heat loss away from the heat exchanger duct 5. The gaseous cooling flow 8 is able to absorb a second heat loss from a second converter component 20 during operation and conduct this away from the second converter component 20.

By way of example, the second converter component 20 is a power semiconductor module with power semiconductor switches and a heat sink. In FIG. 1, the second converter component 20 is arranged within the second interior 4. However, it is also possible for only part of the second converter component 20 to be arranged in the second interior 4, such as the heat sink of the power semiconductor module for example. It is then possible for the power semiconductor switch connected to the heat sink to be arranged partially or entirely in the first interior 3, and also for heat to be dissipated therefrom by way of the gaseous heat flow circuit 6 in the first interior.

The formation of the gaseous cooling flow 8 and the thermal efficiency thereof is further improved to the effect that a second inlet opening 17 at the second interior 4, in FIG. 1 this is also an inlet opening on the converter housing 2, allows the gaseous cooling flow 8 to be conducted from outside into the second interior before the transfer of the first and/or the second heat loss. After the first and/or the second heat loss has been absorbed from the second interior 4 by the gaseous cooling flow 8, the gaseous cooling flow 8 is conducted away toward outside the second interior 4, to conduct away the first and/or the second heat loss, via a second outlet opening 18 at the second interior 4, in FIG. 1 this is also an outlet opening on the converter housing 2.

The heat exchanger duct 5 has flow ducts 12, in which the gaseous heat flow circuit 6 is formed in the first flow direction 9, wherein in the manner represented in FIG. 1 only one flow duct 12 can be shown.

Two flow ducts 12 that are spaced apart from one another and lie immediately opposite one another each form an intermediate space 13, through which the gaseous cooling flow 8 flows (due to the manner of representation, this can only be shown in an implied manner in FIG. 1).

The cooling duct 7 is arranged in the region that overlaps with the heat exchanger duct 5 in FIG. 1, such that the first flow direction 9 of the gaseous heat flow circuit 6 runs in parallel in relation to the second flow direction 10 of the gaseous cooling flow 8 and the flow directions 9,10 running in parallel follow opposing directions.

Figure 2:
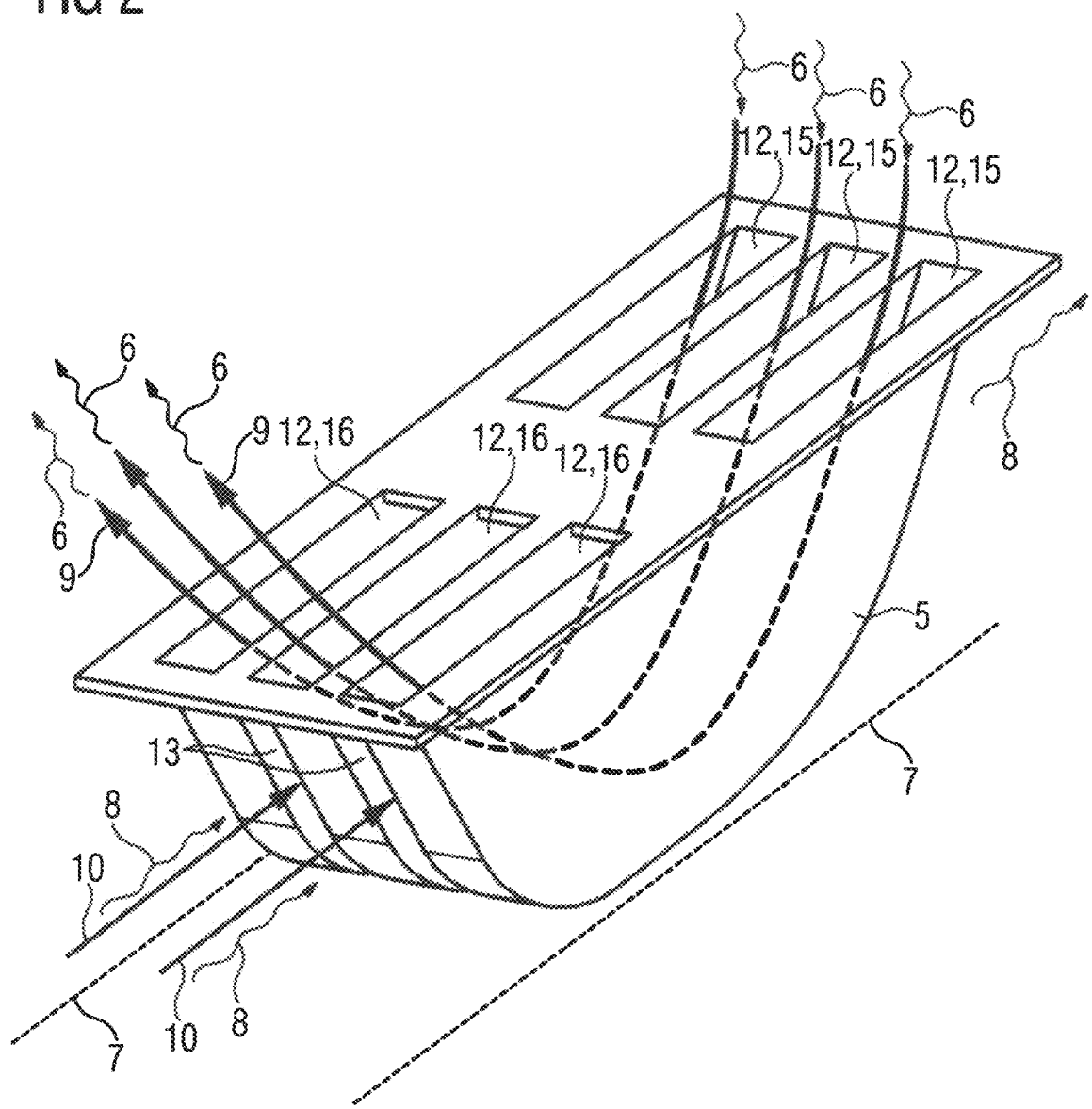
FIG. 2 shows a schematic representation of the heat exchanger duct of the converter according to the invention in accordance with FIG. 1 in a form of spatial representation and FIG. 3 shows a schematic representation of a further heat exchanger duct for the converter according to the invention in a form of spatial representation.

FIG. 2 demonstrates a schematic representation of the heat exchanger duct 5 of the converter according to the invention in accordance with FIG. 1 in a form of spatial representation.

The heat exchanger duct 5 in FIG. 2 has three flow ducts 12. Via the first inlet opening 15 of the heat exchanger duct 5, during operation, the gaseous heat flow circuit 6 with the first heat loss of the first interior flows into the flow ducts 12 in the first flow direction 9. The flow ducts 12 that are spaced apart from one another and lie immediately opposite one another here form two intermediate spaces 13, through which the gaseous cooling flow 8 flows in the second flow direction 10, at least partially transfers the first heat loss from the gaseous heat flow circuit 6 and conducts it away from the heat exchanger duct 5 via the cooling channel 7. Via the first outlet opening 16, the gaseous heat flow circuit 6 flows out of the heat exchanger duct 5 in the first flow direction 9 after at least partially emitting the first heat loss.

Figure 3:
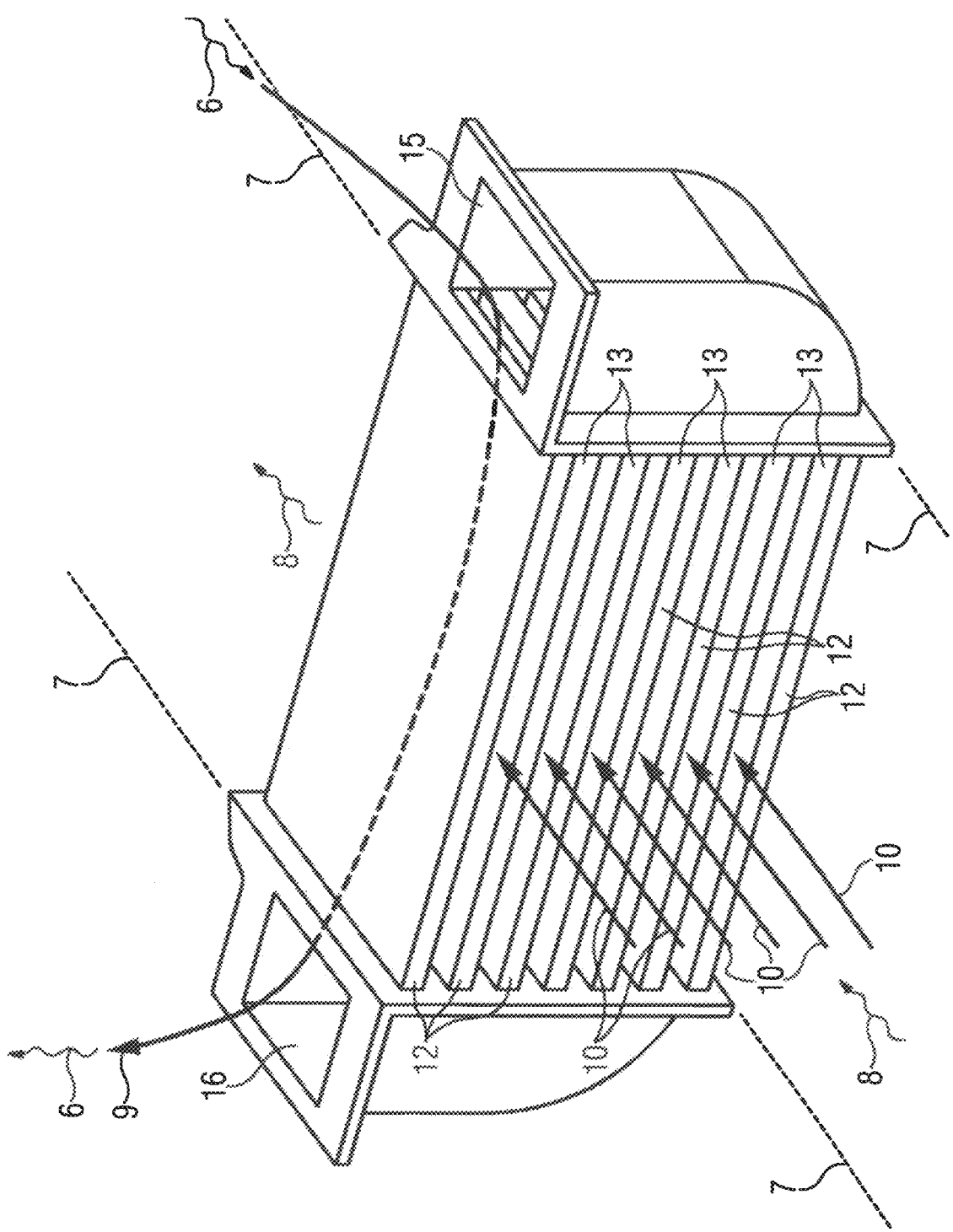

FIG. 3 shows a schematic representation of a further heat exchanger duct 5 for the converter according to the invention in a form of spatial representation.

The heat exchanger duct 5 in FIG. 3 has seven flow ducts 12. Via a first inlet opening 15 of the heat exchanger duct 5, during operation, a gaseous heat flow circuit 6 with a first heat loss of a first interior flows into the flow ducts 12 in a first flow direction 9. The flow ducts 12 that are spaced apart from one another and lie immediately opposite one another here form six intermediate spaces 13, through which a gaseous cooling flow 8 flows in the second flow direction 10, at least partially transfers the first heat loss from the gaseous heat flow circuit 6 and conducts it away from the heat exchanger duct 5 via a cooling channel 7. Via a first outlet opening 16, the gaseous heat flow circuit 6 flows out of the heat exchanger duct 5 in the first flow direction 9 after at least partially emitting the first heat loss.

As opposed to the heat exchanger shown in FIG. 1 and FIG. 2, the cooling duct 7 in FIG. 3 is arranged in a region that overlaps with the heat exchanger duct 5 such that the first flow direction 9 of the gaseous heat flow circuit 6 runs perpendicularly in relation to the second flow direction 10 of the gaseous cooling flow 8.

The invention claimed is:

1. A converter, converter, comprising:
    a converter housing having a first interior and a second interior, said first interior arranged separately from said second interior and having a part which protrudes into the second interior to form a heat exchanger duct, said second interior configured to form a cooling duct;
    a gaseous heat flow circuit formed within the first interior, said gaseous heat flow circuit flowing in through an inlet opening of the heat exchanger duct and flowing out through an outlet opening of the heat exchanger duct; and
    a gaseous cooling flow flowing through the cooling duct and flowing around the heat exchanger duct,
    wherein the cooling duct formed by the second interior is arranged in a region that overlaps with the heat exchanger duct such that a first flow direction of the gaseous heat flow circuit runs substantially perpendicularly or parallel in relation to a second flow direction of the gaseous cooling flow,
    wherein the converter is configured to dissipate heat loss generated during operation such that a first heat loss generated in the first interior is at least partially absorbed by the gaseous heat flow circuit and at least partially transferred from the gaseous heat flow circuit to the gaseous cooling flow via the heat exchanger duct and conducted away by the gaseous cooling flow, and a second heat loss generated in the second interior is at least partially absorbed by the gaseous cooling flow and conducted away by the gaseous cooling flow.

2. The converter of claim 1, wherein the first interior forms a space which is substantially hermetically sealed, at least during operation of the converter.

3. The converter of claim 1, wherein the gaseous heat flow circuit in the first interior is exclusively formed by free convection.

4. The converter of claim 1, wherein the gaseous heat flow circuit in the heat exchanger duct is exclusively formed by free convection.

5. The converter of claim 1, further comprising a flow generator for the first interior, said flow generator configured to generate in the first interior a forced convection which forms the gaseous heat flow circuit.

6. The converter of claim 1, further comprising a flow generator for the first interior, said flow generator configured to generate in the heat exchanger duct a forced convection which forms the gaseous heat flow circuit.

7. The converter of claim 1, wherein the first and second flow directions running in parallel follow a common direction or opposing directions.

8. The converter of claim 1, wherein the heat exchanger duct includes at least two flow ducts arranged in spaced-apart relationship such as to define in a region where the at least two flow ducts lie immediately opposite one another an intermediate space through which the gaseous cooling flow is capable of flowing.

9. The converter of claim 8, wherein the at least two flow ducts are arranged in a laminated manner.

10. The converter of claim 1, wherein the gaseous heat flow circuit is exclusively formed by free convection.

11. The converter of claim 1, wherein the gaseous heat flow circuit in the region of the cooling duct that overlaps with the heat exchanger duct is exclusively formed by free convection.

12. The converter of claim 1, further comprising a flow generator for the second interior, said flow generator generating in the second interior a forced convection which forms the gaseous cooling flow.

13. The converter of claim 1, further comprising a flow generator for the second interior, said flow generator generating a forced convection in the region of the cooling duct that overlaps with the heat exchanger duct, which forced convection forms the gaseous cooling flow.

14. The converter of claim 1, wherein the second interior includes an inlet opening and/or an outlet opening, with the gaseous cooling flow being guided into the cooling duct via the inlet opening of the second interior and/or guided out of the cooling duct via the outlet opening of the second interior.

15. The converter of claim 1, further comprising a converter component at least partially arranged in the first interior and generating the first heat loss or conducting the first heat loss away.

16. The converter of claim 1, further comprising a converter component at least partially arranged in the second interior and generating the second heat loss or conducting the second heat loss away.

* * * * *